United States Patent [19]

Ohtani

[11] Patent Number: 4,472,333
[45] Date of Patent: Sep. 18, 1984

[54] CERAMIC SUBSTRATE FOR SEMICONDUCTOR PACKAGE AND METHOD OF MANUFACTURE

[75] Inventor: Hiroshi Ohtani, Mi-Ne, Japan

[73] Assignee: Narumi China Corporation, Aichi, Japan

[21] Appl. No.: 307,062

[22] Filed: Sep. 30, 1981

[30] Foreign Application Priority Data

Oct. 1, 1980 [JP] Japan ............................... 55-138147

[51] Int. Cl.³ .............................................. C04B 33/32
[52] U.S. Cl. ........................................ 264/67; 264/118
[58] Field of Search ................................ 264/67, 118

[56] References Cited

U.S. PATENT DOCUMENTS

| | | | |
|---|---|---|---|
| 3,768,144 | 10/1973 | Heinss | 264/118 |
| 4,031,178 | 6/1977 | Johnson | 264/67 |
| 4,124,665 | 11/1978 | Petersen | 264/67 |
| 4,131,664 | 12/1978 | Flowers | 264/118 |
| 4,159,295 | 6/1979 | Mazzuchelli | 264/67 |
| 4,165,350 | 8/1979 | Greenberg | 264/60 |
| 4,175,106 | 11/1979 | Clarke | 264/118 |

FOREIGN PATENT DOCUMENTS 383774 11/1932 United Kingdom ................ 264/67

Primary Examiner—John Parrish
Attorney, Agent, or Firm—Oblon, Fisher, Spivak, McClelland & Maier

[57] ABSTRACT

A ceramic substrate for use as a semiconductor package which includes a plate member having an engraved cavity portion on a first face portion thereof and having a rounded corner on a peripheral surface opposite the first face portion and having a first and second stepped crest formed along the edge formed at the boundary of a second face portion opposite said first face portion for increasing impact resistance to chipping and cracking of the ceramic substrate. A method of manufacturing the ceramic substrate includes adding the ceramic powder to a first mold member, pressing a force applying member into the first mold member, forming on the ceramic substrate a first and second stepped crest, sintering the ceramic substrate and grinding at least one of the first and second stepped crests so as to round the at least one of the stepped crests.

1 Claim, 5 Drawing Figures

U.S. Patent    Sep. 18, 1984    4,472,333
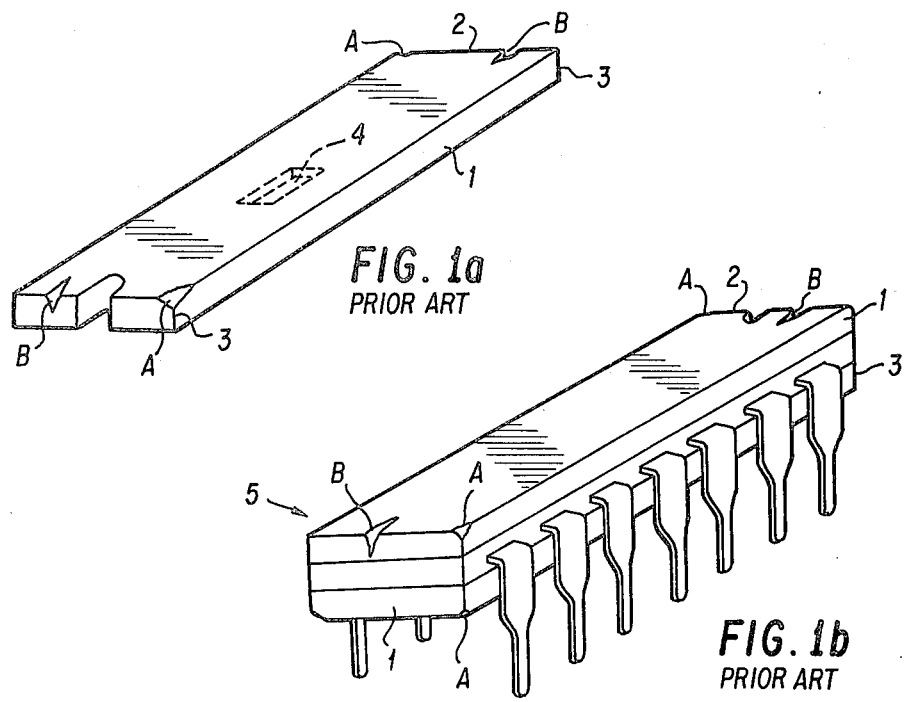
FIG. 1a
PRIOR ART
FIG. 1b
PRIOR ART
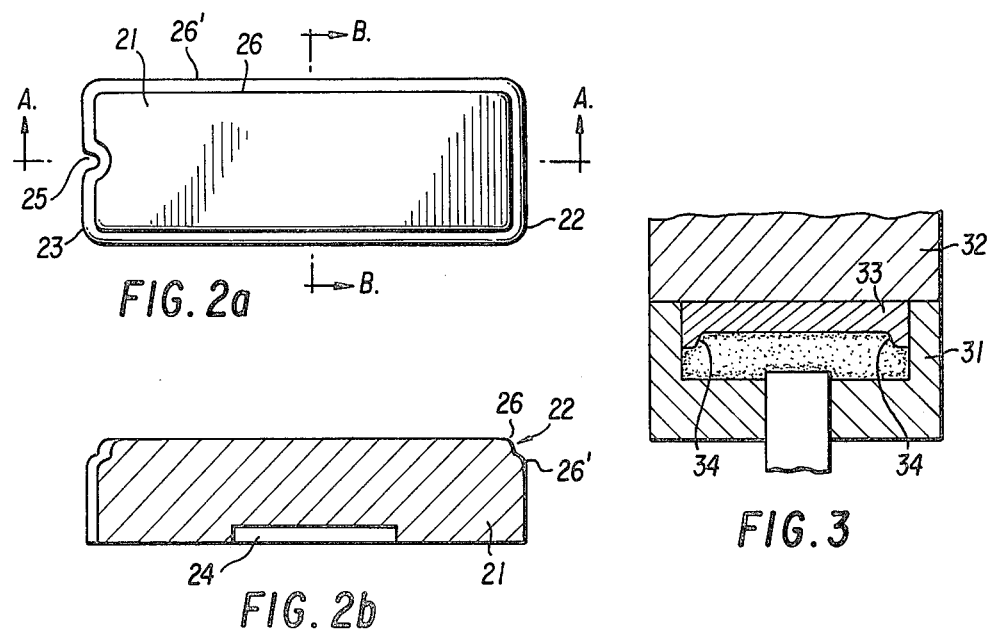
FIG. 2a
FIG. 2b
FIG. 3

CERAMIC SUBSTRATE FOR SEMICONDUCTOR PACKAGE AND METHOD OF MANUFACTURE

BACKGROUND OF THE INVENTION

1. Field of the Invention

This invention relates to a ceramic substrate of a semiconductor package used to seal semiconductor elements airtightly, having a feature suited to prevent the generation of chipping defects and cracks in the ceramic substrate due to the impact of ceramic substrates with each other, especially during assembly and transportation of the semiconductor packages.

2. Description of the Prior Art

Conventionally, as a substrate for semiconductor package as shown in FIG. 1(a), a ceramic substrate 1 formed as a flat plate with a nearly rectangular parallelpiped shape having a cavity 4 engraved in the back center has widely been used due to its excellent performance in electric insulation, chemical stability, wear resistance, hardness, coefficient of thermal expansion, etc. Although ceramic materials have many quite superior characteristics as used as packages of semiconductors, such also are notable for their deficiency in causing a chipping defect A or crack B in the edge 2 or corner portion 3 of ceramic substrate 1 when the same is connected to semiconductor package 5 as shown in FIG. 1(a) and 1(b) as a result of mutual impact of the ceramic substrates 1 in the transportation and assembly of the semiconductor packages. Such chipping defect A and crack B are apt to occur especially to a portion of the sharp edge, i.e. edge portion 2 or corner portion 3 of ceramic substrate 1, causing various problems such as a reduction in the reliability of semiconductor package 5.

SUMMARY OF THE INVENTION

The object of the present invention is therefore to overcome the drawbacks of the conventional ceramic substrate as described above, and serves to offer a substitute ceramic substrate for a semiconductor package with a profile suitable for preventing the occurance of chipping defects or cracks during assembly of the semiconductor package using the ceramic substrate and further during transportation of the assembled semiconductor packages.

In accordance with the present invention the corner portion of the peripheral face of the ceramic substrate is rounded and forms an edge portion having a face boundary without an engraved cavity so as to accomodate the semiconductor element in the thickness direction and having a stepped peripheral face having two rounded angle crests.

BRIEF DESCRIPTION OF THE DRAWINGS

Various other objects, features and attendant advantages of the present invention will be more fully appreciated as the same becomes better understood from the following detailed description when considered in connection with the accompanying drawings in which like reference characters designate like or corresponding parts through the several views and wherein:

FIGS. 1(a), (b) are perspective views of a ceramic substrate of a conventional semiconductor package;

FIGS. 2(a), (b) are a plan view and sectional view at A—A line of an exemplary embodiment of the ceramic substrate for semiconductor package in accordance with the present invention; and FIG. 3 is a sectional view of a metal mold used for molding of a ceramic substrate for a semiconductor package in accordance with the present invention.

DETAILED DESCRIPTION OF THE PREFERRED EMBODIMENT

FIGS. 2(a), (b) are drawings of an exemplary embodiment of the ceramic substrate for a semiconductor package according to the present invention, in which FIG. 2(a) is a plan view and FIG. 2(b) is a sectional view taken along line A—A of an end face portion in the longitudinal direction of a nearly rectangular parallelepiped flat plate shaped ceramic substrate 21 of 2 cm width, 3 cm length and 1.5 mm thickness which is formed with an approximately 1 mm radius semicircular notch 25 for automatic insertion, and an approximately 0.4 mm radius roundness formed in the corner portion 23 of the peripheral face of the above-noted ceramic substrate 21. Edge portion 22 is formed as the boundary of the face opposite to the face in which cavity 24 accomodating the semiconductor element is formed and the peripheral face of ceramic substrate 21 forms an approximately 0.1 mm step along the periphery thereof and includes stepped shape formed with two crests 26, 26' having a radius of curvature approximately 0.04 to 0.06 mm.

In accordance with the above-noted composition of ceramic substrate 21 when ceramic substrates 21 randomly collide with each other in assembly of the semiconductor package or in transportation of assembled semiconductor packages, because of the roundness of corner portion 23, such reduces the impact forces which act on the corner and it therefore becomes difficult to generate chipping defects or cracks in corner portion 23. Thus the forces applied to the edge portion 22 are dispersed to the two crests 26, 26' and are eased because of edge 22 being formed in a stepped shape by such rounded crests 26, 26'. Therefore chipping defects and cracks are more difficult to occur in portion 22.

The results of tests performed on the semiconductor packages assembled with the ceramic substrates as explained in the above exemplary embodiment are shown in Table 1.

TABLE 1

|  | Group A (100 pcs) | | Group B (100 pcs) | | Total | |
| --- | --- | --- | --- | --- | --- | --- |
|  | Number of Defects & Cracks | Rate % | Number of Defects & Cracks | Rate % | Number of Defects & Cracks | Rate % |
| Semiconductor package assembled with a conventional ceramic substrate | 15 | 15 | 17 | 17 | 32 | 16 |
| Semiconductor package assembled with the ceramic | 2 | 2 | 3 | 3 | 5 | 2.5 |

TABLE 1-continued

|  | Group A (100 pcs) | | Group B (100 pcs) | | Total | |
| --- | --- | --- | --- | --- | --- | --- |
|  | Number of Defects & Cracks | Rate % | Number of Defects & Cracks | Rate % | Number of Defects & Cracks | Rate % |
| substrate of the exemplary embodiment of present invention | | | | | | |

The test procedure was as follows; each total group of 200 pcs of semiconductor packages assembled with a conventional ceramic substrate, and semiconductor packages assembled with the ceramic substrates 21 of the exemplary embodiment of this invention as explained in FIGS. 2(a), (b) were prepared, and then divided into two groups A and B respectively including 100 pcs of such assemblies. Subsequently separable 5 pc groups of the assemblies of each group of semiconductor packages assembled with conventional ceramic substrate and of semiconductor packages asembled with the ceramic substrate 21 related with the exemplary embodiment of this invention were each packed in a 50 cm long, concave section, hollow plastic semiconductor package holder and the holder was then rotated in a vertical planar direction at an angular speed of 180°/sec. for 10 revolutions. The packages were then examined to determine the quantity of packages having chipping defects or cracks.

It is obvious from the Table 1 that semiconductor packages assembled with ceramic substrate 21 of the exemplary embodiment of this invention yielded chipping defects or cracks only on 5 pieces out of a total of 200 assemblies versus 32 pieces out of a total of 200 semiconductor packages assembled with conventional ceramic substrates which yielded chipping defects or cracks, resulting in the rate of generation of chipping defects or cracks being reduced by a ratio of 1/6.

The ceramic substrate constructed with the shape as described above is manufactured by press molding ceramic powder with a metallic mold by pressing ceramic powder disposed in a bottom mold member 31 using a top force applying mold member 32 having a top force plug 33 projecting therefrom with a trapezoidal section projection 34 along the periphery thereof and which fits into bottom mold member 31 as shown in FIG. 3. Non-sintered ceramic substrate 21 is formed so as to be of a nearly rectangular parallelepiped form having about 0.4 mm radius to the corner portion 23, and has edge portion 22 formed with steps with crest 26 having an approximate 0.05 mm radius and with a sharp edge crest 26'. Non-sintered ceramic substrate 21 is then sintered by a conventional method, and then a rounding step is applied only to the crest 26' by grinding the same by a vibration mill method or a rotary mill method. Therefore the processing time for the chamfering is significantly reduced in comparison with the chamfering process of a conventional method.

As explained hereinabove the ceramic substrate for the semiconductor package related to this invention is formed such that its corner or edge portion which is most likely to cause a chipping defect or crack by mutual impact of ceramic substrates forms an edge portion with slightly stepped and rounded first and second crests which enables the impact force on the corner or edge part of the ceramic substrate due to random impact of the ceramic substrates with each other to be reduced, and thus prevents chipping defects or cracks occuring in the ceramic substrate, resulting in the overall improvement of yield rate of non-defective substrates and reliability of such substrates.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A method of manufacturing a ceramic substrate for a semiconductor package utilizing a first and second mold member and a force applying member projecting from said second mold member, said force applying member having a trapezoidal section projecting therefrom, which comprises:

adding ceramic powder to said first mold member;

pressing said force applying member into said first mold member so as to compact said ceramic powder and form said ceramic substrate;

forming on said ceramic substrate a nearly rectangular parallelepiped form having rounded corners and a stepwisely formed portion with an upper crest portion having a rounded edge and a sharp lower crest portion;

sintering said ceramic substrate; and grinding off said sharp lower crest portion of said substrate to provide a rounded crest so as to increase impact resistance to chipping and cracking upon said ceramic substrate being impacted with an adjacent ceramic substrate wherein said stepwise forming of said upper and lower stepped crest further comprises forming said upper and lower stepped crests so as to have a radius of curvature of between 0.04 and 0.06 mm inclusive.

* * * * *